United States Patent [19]

Bach et al.

[11] Patent Number: 5,793,615
[45] Date of Patent: Aug. 11, 1998

[54] MULTIPLEX CONTROL OF COMPONENTS AND SUBSYSTEMS IN MOTOR VEHICLES

[75] Inventors: Friedrich Bach, Nürnberg; Jürgen Hitz, Nenoelsnitz; Helmut Steinhardt, Nürnberg, all of Germany

[73] Assignee: Framatome Connectors International, Paris La Defense, France

[21] Appl. No.: 624,255

[22] Filed: Mar. 29, 1996

[30] Foreign Application Priority Data

Mar. 30, 1995 [DE] Germany .................. 195 11 755.7

[51] Int. Cl.⁶ ...................................................... H05K 7/20
[52] U.S. Cl. ................ 361/752; 361/785; 361/728; 361/730; 361/733; 439/34; 439/49
[58] Field of Search ................... 361/752, 785, 361/733, 715, 728, 730, 737, 690; 439/34–36, 49

[56] References Cited

U.S. PATENT DOCUMENTS

| | | | |
|---|---|---|---|
| 2,777,893 | 1/1957 | Rosso | 361/752 |
| 3,320,351 | 5/1967 | Glickman | 361/730 |
| 3,586,917 | 6/1971 | Oates | 361/730 |
| 4,388,490 | 6/1983 | Spector | 361/730 |
| 4,533,976 | 8/1985 | Suwa | 361/730 |
| 4,717,990 | 1/1988 | Tugcu | 361/752 |
| 4,811,168 | 3/1989 | Chesnut | 361/752 |
| 4,922,382 | 5/1990 | Hobbins | 361/730 |
| 5,244,397 | 9/1993 | Anhalt | 361/737 |
| 5,390,081 | 2/1995 | St. Pierre | 361/752 |
| 5,424,586 | 6/1995 | Hattori et al. | 361/752 |
| 5,530,622 | 6/1996 | Takiar | 361/737 |
| 5,559,675 | 9/1996 | Hsieh et al. | 361/715 |
| 5,646,827 | 7/1997 | Hirao et al. | 361/752 |

FOREIGN PATENT DOCUMENTS

| | | |
|---|---|---|
| 3930153 A1 | 3/1991 | Germany . |
| 4221972 A1 | 1/1994 | Germany . |
| 4233865 A1 | 4/1994 | Germany . |
| 4410061 A1 | 9/1994 | Germany . |

*Primary Examiner*—William M. Shoop, Jr.
*Assistant Examiner*—Peter Ganjian
*Attorney, Agent, or Firm*—Law Offices Pollock, Vande Sande & Priddy

[57] ABSTRACT

This invention relates to a multiplex control of components and subsystems in motor vehicles having: a central electronic control unit and multiplex bus electronic units (3) associated with each component and each subsystem. The multiplex bus electronic units (3) are incorporated in the casings (2) of the connectors, the same having on the component side (2b) the requisite number of contacts and on the back a four-pole multiplex connector (1, 2a) for two signal lines and two power lines.

7 Claims, 2 Drawing Sheets

5,793,615

MULTIPLEX CONTROL OF COMPONENTS AND SUBSYSTEMS IN MOTOR VEHICLES

FIELD OF THE INVENTION

This invention relates to a multiplex control of components and subsystems in motor vehicles. Multiplex controls of this kind are used in modern motor vehicles where the numerous functions of the individual components are monitored and controlled by multiplexing.

BACKGROUND OF THE INVENTION

The result of the trend to increasingly reliable and more comfortable motor vehicles in almost all price categories is that electric servomotors and electronic systems for monitoring the functioning of various components have by now become standard equipment in almost all vehicle categories. The conventional form of wiring these components would lead to unusable wiring harnesses whose weight, and space requirements and costs would be unacceptable. The use of multiplexing to control and monitor such components has already greatly reduced the number of lines required. A reduced number of signal lines deal with a number of control functions. A central electronic control unit transmits control signals to the various components and evaluates reports from components of existing states or malfunctioning. The central electronic system is usually disposed at a location in a vehicle which is protected from external influences, preferably near or in the foot space of the passenger compartment or the vehicle interior near the back of the dashboard. The sensitivity of electronic components to external influences such as high and low temperatures, rapid temperature changes, vibrations, mechanical impacts, humidity and dirt and dust has so far made it impossible to site electronic components elsewhere in the vehicle.

SUMMARY OF THE INVENTION

It is the object of this invention so to improve a multiplex control of the kind specified that the wiring required can be further reduced, the central electronic system can be simplified, the number of switches can be reduced and relays are not required.

According to the invention the connector disposed on the component or subsystem concerned has a multiplex bus electronic unit which is connected by way of two signal lines to the central electronic control unit and which can dialogue therewith, inter alia to control the two power lines which are also present.

The electronic unit is preferably a Controller Area Network (CAN) bus chip which is disposed on a circuit board support and is incorporated in the casing of the connector.

Preferably, the component side of the connector is compatible with conventional components not originally designed for multiplex control. The storage of spare parts and change of model is therefore simplified and standardization for a large number of countries can be achieved.

BRIEF DESCRIPTION OF THE DRAWING

The invention will be described in greater detail hereinafter with reference to a preferred embodiment and to the drawing.

DESCRIPTION OF PREFERRED EMBODIMENT

Figure 1:
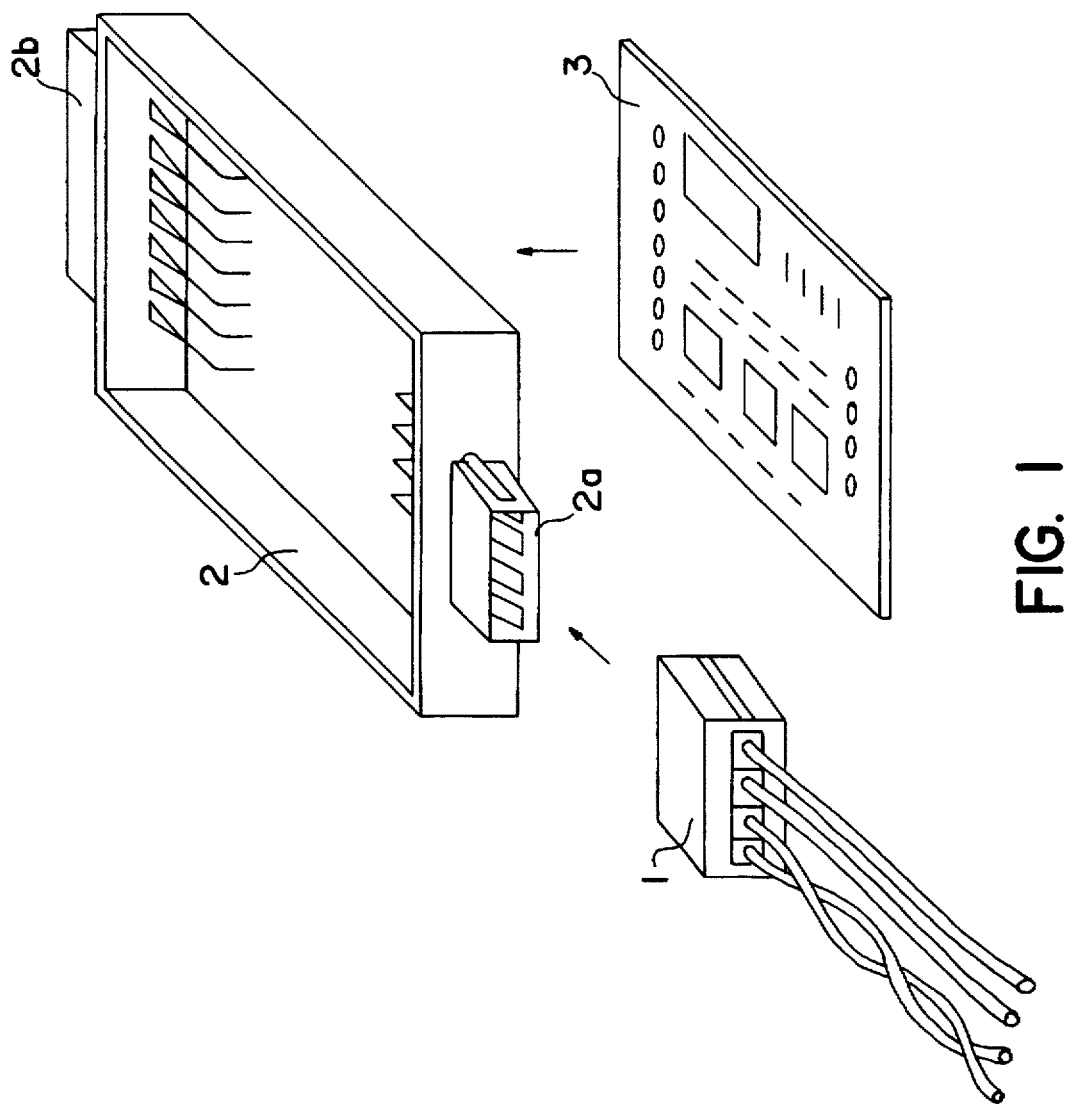
FIG. 1 is a schematic perspective view of a connector for use in the multiplex control system according to the invention.
Figure 2:
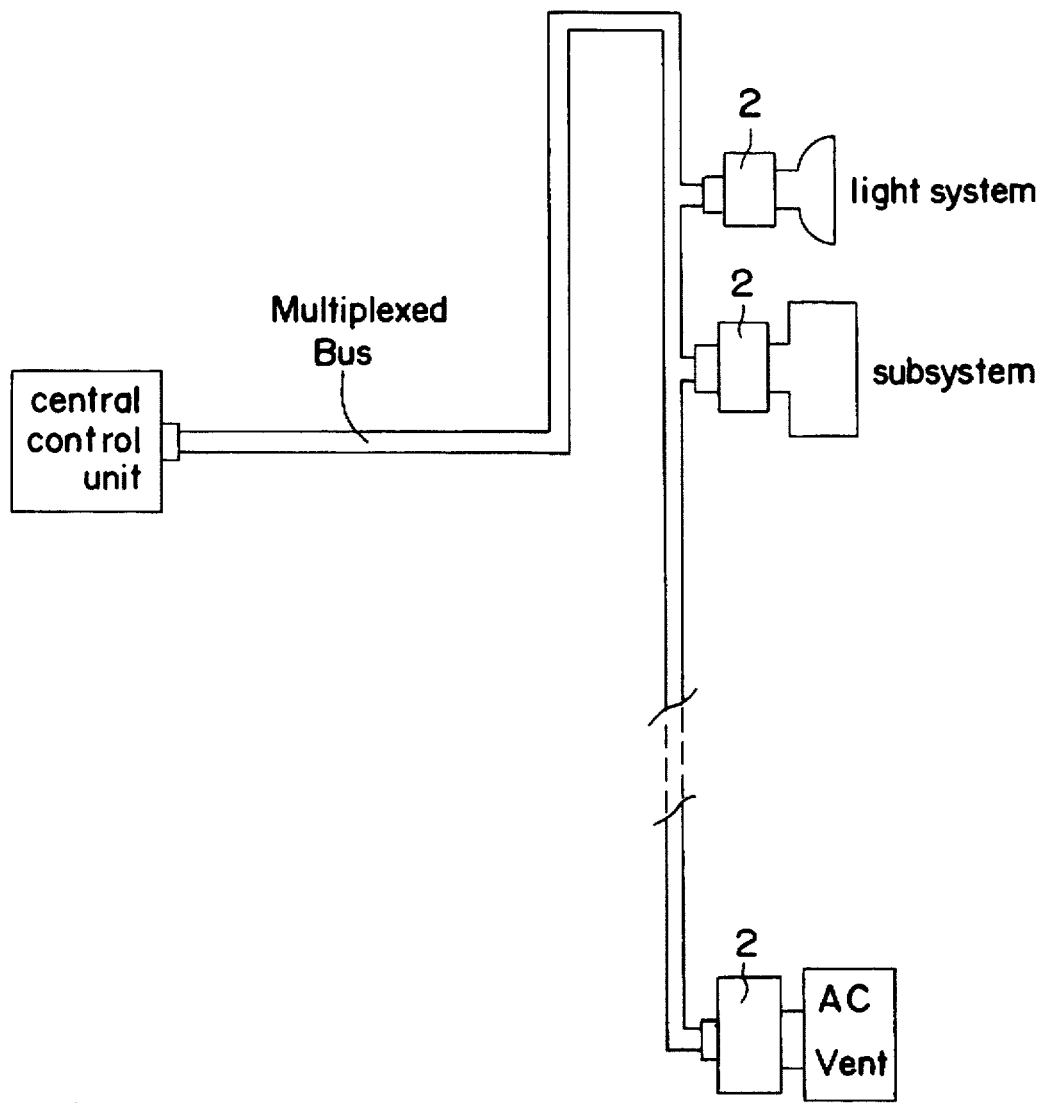
FIG. 2 is an example of a system in which the present invention may be used.

The connector has on the wiring side a four-pole multiplex connector 1 with two power lines and two intertwisted signal lines, the connector 1 being pushed on to multiplex connector part 2a on the casing 2. This connection is waterproof. The casing 2 is parallelepipedic and receives the circuit board support 3 which may have extrusion-coated contact blades for the multiplex connection and the component connection. To improve heat removal, the casing cover 4 may be made of aluminum for optimum cooling of the power semiconductors. Both the multiplex connector and the component connection are waterproof and polarized. The circuit board has a CAN bus electronic chip and a power section. The circuit board also has contact zones 5, 6 for multiplex and aggregate connection, respectively. The power switches are of the semiconductor type, and a relay circuit arrangement is therefore not required. All other circuit elements can be designed for reduced requirements since there is no high-power switching.

A multiplex bus at the component or subsystem facilitates complex monitoring and control of a wide variety of functions at the place of the component without any need for signal lines other than the two multiplex signal lines. A brief description of possible functions will now be given with reference to the example of a light and warning system.

In normal vehicle operation conventional functions, such as lowered beam, main beam, side and tail lights, number plate illumination, fog lamp, rear fog lamp, flashing indicators, stop light, and reversing light, are required. It is logical to check that they are operating satisfactorily and to report malfunctioning, for example, the failure of a light bulb, to the central electronic system and give the driver an indication. Also, preprogrammed emergency action beyond the mere indication of a defect can be taken. For example, in the event of a lowered-beam bulb failing, the main beam of the same headlamp can be switched on in order not to mislead oncoming traffic into thinking that the vehicle is a motorcycle. However, since the main beam would dazzle oncoming traffic, the intensity of illumination is reduced to an extent obviating dazzle. Similarly, defective flashing indicators can be replaced by flashing stop lights and defective stop lights can be replaced by a dimmed fog rear lamp in emergency programs as a result of a defect being detected. In the absence of a dialoguing electronic element at the corresponding component, these functions would considerably increase the number of necessary signal lines and of power switches, which in such a case would be relays, required at the component. Consequently, since wiring lengths and switching elements cannot be increased ad infinitum, the technology according to the invention makes it possible for the first time to use a "smart" autoelectronic system in the manner described hereinabove.

We claim:

1. A casing with connectors for multiplex control of components and subsystems in motor vehicles, said vehicles having a central logic control unit, and at least one multiplex bus electric unit associated with each component and each subsystem, said casing comprising:

(a) a casing body incorporating said at least one multiplex bus electric unit;

(b) a component connector incorporated in said casing body, said component connector having a plurality of contacts, whereby said component communicates with at least one of said components or subsystems; and (c) a multiplex connector part on said casing body adapted to receive a four-pole multiplex connector receiving two signal lines and two power lines which communicate with said multiplex bus electric unit via said multiplex connector part.

2. A casing with connector for multiplex control of components according to claim 1, wherein the plurality of contacts on the component connector are compatible with conventional companion connector parts of components not adapted to multiplex functions.

3. A casing with connector for multiplex control of components according to claim 1, wherein said casing body is waterproof.

4. A casing with connector for multiplex control of components according to claim 1, wherein the multiplex bus electronic unit is disposed on a circuit board having contact zones for multiplex and aggregate connection.

5. A casing with connector for multiplex control of components according to claim 1, wherein said casing has a cover which is constituted by an aluminum plate for heat remove.

6. A casing with connector for multiplex control of components according to claim 1, wherein the component connector and the four-pole multiplex connector are pole-coded.

7. A casing with connector for multiplex control of components according to claim 1, wherein the signal lines are intertwisted.

\* \* \* \* \*